(12) United States Patent
Ryu et al.

(10) Patent No.: US 11,696,405 B2
(45) Date of Patent: Jul. 4, 2023

(54) DISPLAY DEVICE

(71) Applicant: Samsung Display Co., LTD., Yongin-si (KR)

(72) Inventors: Tae Hyun Ryu, Asan-si (KR); Tae Beom Kim, Asan-si (KR); Yoon Seop Shim, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 134 days.

(21) Appl. No.: 17/231,507

(22) Filed: Apr. 15, 2021

(65) Prior Publication Data

US 2022/0071011 A1  Mar. 3, 2022

(30) Foreign Application Priority Data

Aug. 31, 2020 (KR) .................. 10-2020-0110163

(51) Int. Cl.
| | | |
|---|---|---|
| *H05K 1/14* | (2006.01) | |
| *H05K 1/18* | (2006.01) | |
| *H05K 1/11* | (2006.01) | |
| *H05K 1/02* | (2006.01) | |
| *G06F 3/041* | (2006.01) | |
| *H10K 59/131* | (2023.01) | |

(52) U.S. Cl.
CPC ......... *H05K 1/144* (2013.01); *G06F 3/04164* (2019.05); *H05K 1/0269* (2013.01); *H05K 1/118* (2013.01); *H05K 1/189* (2013.01); *H05K 2201/058* (2013.01); *H05K 2201/09063* (2013.01); *H05K 2201/09936* (2013.01); *H10K 59/131* (2023.02)

(58) Field of Classification Search
CPC ...... H05K 1/144; H05K 1/0269; H05K 1/118; H05K 1/189; H05K 2201/058; H05K 2201/09063
USPC ........................................................ 345/178
See application file for complete search history.

(56) References Cited

U.S. PATENT DOCUMENTS

| | | | |
|---|---|---|---|
| 8,427,624 B2 * | 4/2013 | Matsui .............. | G02F 1/134363 349/190 |
| 2015/0168755 A1 * | 6/2015 | Matsui .................. | G02F 1/1368 349/42 |

FOREIGN PATENT DOCUMENTS

| | | |
|---|---|---|
| CN | 204119637 | 1/2015 |
| CN | 20119637 | * 10/2015 |
| JP | 2019-175943 | 10/2019 |
| KR | 10-2016-0004528 | 1/2016 |
| KR | 10-2019-0080271 | 7/2019 |
| KR | 10-2024860 | 9/2019 |

\* cited by examiner

*Primary Examiner* — Andargie M Aychillhum
(74) *Attorney, Agent, or Firm* — Kile Park Reed & Houtteman PLLC (57) ABSTRACT

A display device may include a main flexible printed circuit including a first alignment mark and electrically connected to a first panel; and a touch flexible printed circuit including a second alignment mark and electrically connected to a second panel that is perpendicular to the first panel, wherein the main flexible printed circuit is electrically connected to the touch flexible printed circuit through a pad region, and the touch flexible printed circuit includes a first overcoat region disposed between the first alignment mark and the second alignment mark.

20 Claims, 9 Drawing Sheets

DISPLAY DEVICE

CROSS-REFERENCE TO RELATED APPLICATION(S)

This application claims priority to and the benefit of Korean Patent Application No. 10-2020-0110163 filed in the Korean Intellectual Property Office (KIPO) on Aug. 31, 2020, the entire contents of which are incorporated herein by reference.

BACKGROUND

1. Technical Field

The described technology relates generally to a display device.

2. Description of the Related Art

Flat panel displays (FPD) such as an organic light emitting diode display (OLED), a liquid crystal display (LCD), or an electrophoretic display (EPD) include a field generating electrode and an electro-optical active layer. As the electro-optical active layer, the organic light emitting device includes an organic emission layer, the liquid crystal display includes a liquid crystal layer, and the electrophoretic display includes charged particles. The field generating electrode may be electrically connected to a switching element such as a thin film transistor and may receive a data signal, and the electro-optical active layer displays images by converting the data signal into an optical signal.

The display device may include a touch sensing function for allowing an interaction with a user in addition to a function for displaying an image. The touch sensing function is used by the display device to find touch information such as whether an object approaches or touches a screen and a touch location thereof by sensing changes in pressure, charges, light, and the like which are applied to the screen, when the user writes text or draws figures by approaching or touching the screen using a finger or a touch pen. The display device may receive an image signal based on such touch information.

The above information disclosed in this Background section is only for enhancement of understanding of the background of the described technology, and therefore it may contain information that does not form the prior art that is already known in this country to a person of ordinary skill in the art.

SUMMARY

The described technology has been made in an effort to provide a display device with an overcoat forming structure (or a coverlay on structure) for preventing a touch flexible printed circuit from being damaged in a process for compressing a main flexible printed circuit (MFPC) and a touch flexible printed circuit (TFPC) and bonding them.

The described technology has been made in another effort to provide a display device for preventing interference between an alignment mark and an opening in an overcoat forming structure.

An embodiment provides a display device including a main flexible printed circuit including a first alignment mark and electrically connected to a first panel; and a touch flexible printed circuit including a second alignment mark and electrically connected to a second panel that is perpendicular to the first panel, wherein the main flexible printed circuit may be electrically connected to the touch flexible printed circuit through a pad region, and the touch flexible printed circuit may include a first overcoat region disposed between the first alignment mark and the second alignment mark.

The first overcoat region may be disposed between the second alignment mark and a first edge of the touch flexible printed circuit.

The touch flexible printed circuit may include a first opening that penetrates through the touch flexible printed circuit on an opposite side to the first overcoat region with respect to the second alignment mark; and a second overcoat region disposed between the second alignment mark and the first opening.

A width of the first overcoat region may be greater than a width of the second overcoat region.

A width of the first overcoat region may be equal to or less than a width of the second overcoat region.

The first overcoat region and the second overcoat region may be disposed below the pad region.

The main flexible printed circuit may include a third alignment mark, and the touch flexible printed circuit may include a fourth alignment mark, and a third overcoat region disposed between the third alignment mark and the fourth alignment mark.

The third overcoat region may be disposed between the fourth alignment mark and a second edge of the touch flexible printed circuit.

The touch flexible printed circuit may include a second opening that penetrates through the touch flexible printed circuit on an opposite side to the third overcoat region with respect to the fourth alignment mark; and a fourth overcoat region disposed between the fourth alignment mark and the second opening.

A width of the third overcoat region may be greater than a width of the fourth overcoat region.

A width of the third overcoat region may be equal to or less than a width of the fourth overcoat region.

The third overcoat region and the fourth overcoat region may be disposed below the pad region.

Another embodiment provides a base film; a first alignment mark and a second alignment mark disposed on the base film for arrangement with a main flexible printed circuit; a first overcoat region provided on the base film and disposed between the first alignment mark and a first edge of the base film; and a second overcoat region disposed between a second edge facing the first edge and the second alignment mark.

The display device may further include a first opening that penetrates through the base film on an opposite side to the first overcoat region with respect to the first alignment mark; and a third overcoat region disposed between the first alignment mark and the first opening.

A width of the first overcoat region may be greater than a width of the third overcoat region.

A width of the first overcoat region may be equal to or less than a width of the third overcoat region.

The display device may further include a second opening that penetrates through the base film on an opposite side to the second overcoat region with respect to the second alignment mark; and a fourth overcoat region disposed between the second alignment mark and the second opening.

A width of the second overcoat region may be greater than a width of the fourth overcoat region.

A width of the second overcoat region may be equal to or less than a width of the fourth overcoat region.

The base film may be electrically connected to the main flexible printed circuit through a pad region.

According to the embodiments, the display device with an overcoat forming structure in which the overcoat is formed between the edge of the touch flexible printed circuit and the alignment mark is provided, so regarding the process for compressing the main flexible printed circuit and the touch flexible printed circuit and the process for manufacturing a display device, damage such as tearing or breaking of the touch flexible printed circuit because of the stress may be prevented and the inferiority rate may be substantially reduced.

According to the embodiments, the sufficient margin between the alignment mark and the opening is secured when the overcoat forming structure is applied, so the accuracy of the bonding process may be highly maintained by preventing the interference between the alignment mark and the opening.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

The disclosure will be described more fully hereinafter with reference to the accompanying drawings, in which embodiments of the disclosure are illustrated. As those skilled in the art would realize, the described embodiments may be modified in various different ways, all without departing from the spirit or scope of the disclosure.

Parts that are irrelevant to the description may be omitted to clearly describe the disclosure, and the same elements will be denoted by the same reference numerals throughout the specification.

The size and thickness of each configuration illustrated in the drawings are arbitrarily illustrated for better understanding and ease of description, but the disclosure is not limited thereto. In the drawings, the thickness of layers, films, panels, regions, etc., may be exaggerated for clarity. The thicknesses of some layers and areas are exaggerated for convenience of explanation.

It will be understood that when an element such as a layer, film, region, or substrate is referred to as being "on" another element, it can be directly on the another element or intervening elements may also be present. In contrast, when an element is referred to as being "directly on" another element, there are no intervening elements present. The word "on" or "above" means positioned on or below the object portion and does not necessarily mean positioned on the upper side of the object portion based on a gravitational direction.

Unless explicitly described to the contrary, the word "comprise," "include," and variations such as "comprising" or "including" will be understood to imply the inclusion of stated elements but not the exclusion of any other elements.

The phrase "in a plan view" means viewing an object portion from the top, and the phrase "in a cross-sectional view" means viewing a cross-section of the object portion vertically cut from the side.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1:
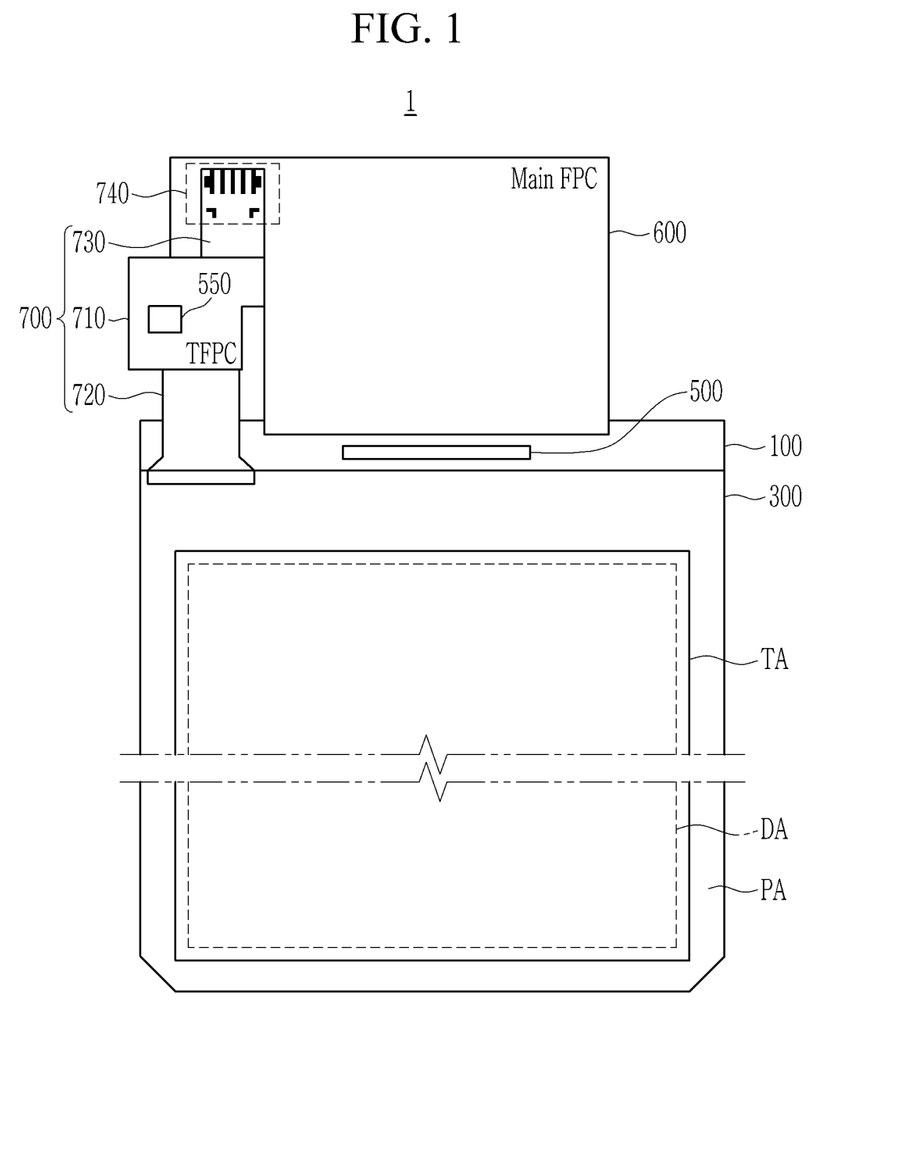
FIG. 1 schematically illustrates a plan view of a display device according to an embodiment.
Figure 2:
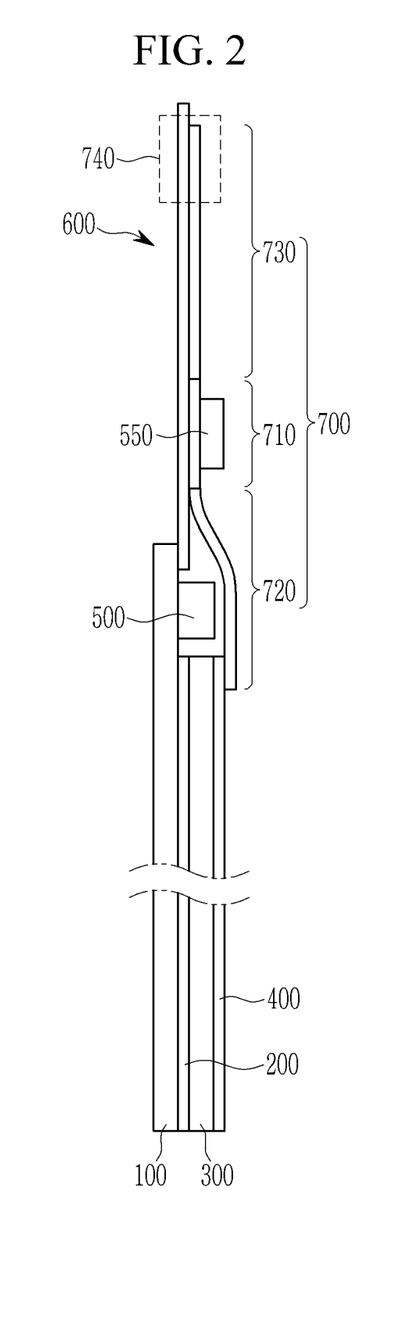
FIG. 2 schematically illustrates a side view of a display device described with reference to FIG. 1.

FIG. 1 illustrates a schematic plan view of a display device according to an embodiment, and FIG. 2 illustrates a schematic side view of a display device described with reference to FIG. 1.

Referring to FIGS. 1 and 2, a display device 1 may include a lower substrate 100, a displaying layer 200, an upper substrate 300, and a touch sensing layer 400. The display device 1 may include a main flexible printed circuit 600 connected to the displaying layer 200 and a touch flexible printed circuit 700 connected to the touch sensing layer 400. The display device 1 may include a displaying driving chip 500 and a touch driving chip 550.

The display device 1 may include a display area DA for displaying images and a peripheral area PA positioned around the display area DA in FIG. 1, and the display area DA may be defined in the displaying layer 200 illustrated in FIG. 2.

Pixels may be disposed in the display area DA. The respective pixels include a thin film transistor (TFT) and a capacitor and may include an electro-optical active layer. Displaying signal lines (not shown) for transmitting driving signals may be positioned in the display area DA, and the displaying signal lines may include a gate line for transmitting a gate signal and a data line for transmitting a data signal. The displaying signal lines may extend to the peripheral area PA and may form a pad portion (not shown) on the lower substrate 100. The displaying layer 200 may include pixels and displaying signal lines electrically connected to the pixels and transmitting signals, and they may be formed on the lower substrate 100.

The touch sensing layer 400 disposed in the touch active area (TA) may be formed on the upper substrate 300. The touch sensing layer 400 may include a touch electrode (not shown) and a touch signal line (not shown) for transmitting and/or receiving signals to/from the touch electrode. The touch signal line may extend to form a pad portion (not shown) on the upper substrate 300.

The touch active area TA may be the entire display area DA, or may include part of the peripheral area PA. Further, part of the display area DA may be the touch active area TA. The touch sensing layer 400 may sense touches in various ways. For example, a touch sensor may be classified into various types such as a resistive type, a capacitive type, an electro-magnetic type (EM), or an optical type.

The displaying driving chip 500 may include driving devices including a data driver for applying a data voltage to the data line, a gate driver for applying a gate-on voltage to the gate line, and a signal controller for controlling operations of the data driver and the gate driver. The displaying driving chip 500 may be positioned on the substrate, for example, in the peripheral area (PA) of the lower substrate 100. In some embodiments, the displaying driving chip 500 may be positioned on the main flexible printed circuit 600 or a printed circuit board (PCB) (not shown).

The touch driving chip 550 may transmit a sensing input signal to the touch sensing layer 400. The touch driving chip 550 may generate touch information such as a touched state and a touched position by processing a sensing output signal from the touch sensing layer 400. The touch driving chip 550 may be positioned on the touch flexible printed circuit 700. In some embodiments, the touch driving chip 550 may be positioned in the peripheral area PA of the substrate, for example, the upper substrate 300, or may be positioned on an additional printed circuit board (PCB) (not shown).

A signal for controlling the displaying driving chip 500 or the displaying layer 200 may be applied through the main flexible printed circuit 600. The main flexible printed circuit 600 may include a first connector attached to an attachment region (not shown) of the lower substrate 100 and connecting the main flexible printed circuit 600 to the displaying layer 200 formed on the lower substrate 100. In this instance, the connection to the displaying layer 200 must be understood to include a connection through the displaying driving chip 500 positioned on the lower substrate 100. A film such as an anisotropic conductive film (ACF) may be used, for ease of adhesion, between the first connector and the attachment region of the lower substrate 100. The main flexible printed circuit 600 may include a second connector for a connection to the touch flexible printed circuit 700, and it may include an input portion for receiving a signal from the outside, and a body portion on which various circuit elements are disposed.

Signals may be transmitted to or received from the touch sensing layer 400 through the touch flexible printed circuit 700. The touch flexible printed circuit 700 may include a body portion 710, a connector 720, a terminal portion 730, and a bonded region 740.

The connector 720 may be attached to an attachment region (not shown) of the upper substrate 300 to electrically connect the touch flexible printed circuit 700 to the touch sensing layer 400 formed on the upper substrate 300. A film such as an anisotropic conductive film may be positioned between the connector 720 and the attachment region of the upper substrate 300. The touch driving chip 550 may be mounted on the body portion 710, and a signal from the touch driving chip 550 and a signal from the touch sensing layer 400 may be transmitted through the connector 720.

The terminal portion 730 may extend from an end of the body portion 710 facing the connector 720. The terminal portion 730 may substantially be rectangular and may be integral with the body portion 710. The terminal portion 730 may be flat in case that no force is applied thereto, or a portion thereof may be bent in a U shape. In the latter case, the U shape may be flattened in case that a force is applied thereto, and it may be restored to the U shape in case that the force is removed. A predetermined portion of the terminal portion 730 may be thinner than other portions thereof, and it may be more flexible than them. The terminal portion 730 may be shorter in case that it is bent than it is flattened.

The bonded region 740 may be formed at the end of the terminal portion 730, and it may be connected to a second connector of the main flexible printed circuit 600. By this, the touch flexible printed circuit 700 may receive an external signal input through an input portion of the main flexible printed circuit 600 and/or a signal generated or processed by a circuit element of the main flexible printed circuit 600. In some embodiments, the touch flexible printed circuit 700 may be connected to the main flexible printed circuit 600 through bonding of the anisotropic conductive film in the bonded region 740.

A cushion layer (not shown) for protecting the lower substrate 100 may be formed on a rear side of the lower substrate 100. A window (not shown) for protecting the lower substrate 100, the displaying layer 200, the upper substrate 300, and the touch sensing layer 400 may be formed on the touch sensing layer 400. In case that the display device is an organic light emitting device, the upper substrate 300 may be an encapsulation substrate for preventing moisture and/or oxygen from permeating from the outside.

To manufacture the display device, a manufacturing process such as a chip on glass (COG) process, a flexible printed circuit (FPC) on glass (FOG) process, a chip on flex (COF) process, a touch film on glass (TFOG) process, an outer lead bonding (OLB) process, or an FPC on film (FOF) process may be performed. Particularly, a compressing and bonding process for configuring a circuit by compressing the touch flexible printed circuit 700 on the main flexible printed circuit 600 at a high temperature and a high pressure by using the anisotropic conductive film may be performed to bond the main flexible printed circuit 600 to the touch flexible printed circuit 700.

Figure 3:
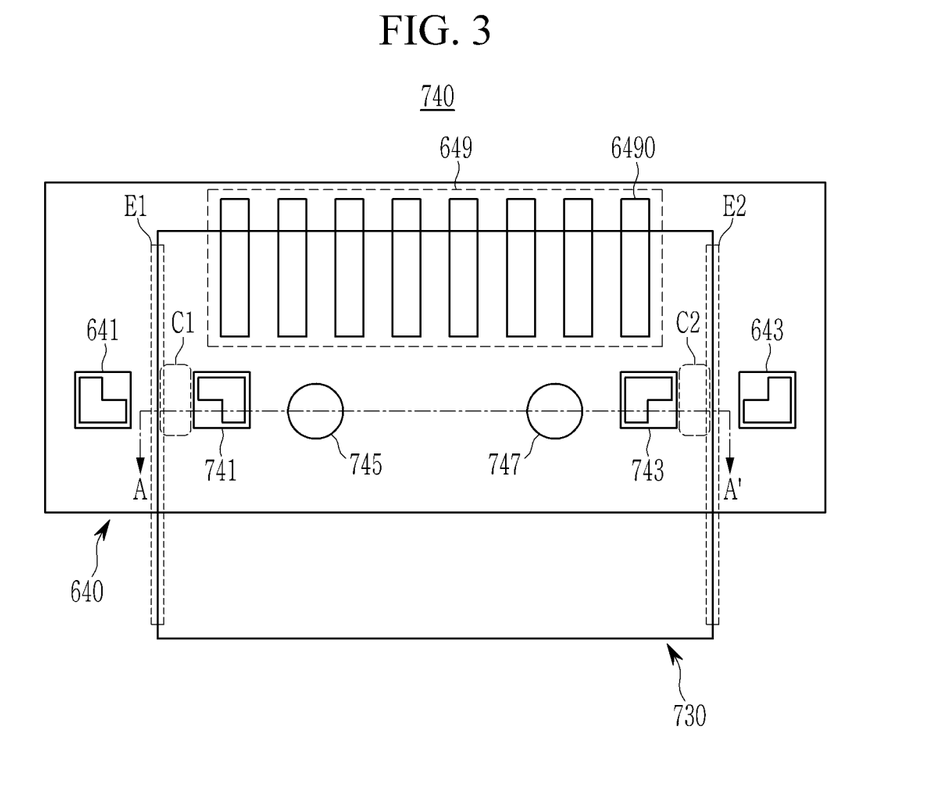
FIG. 3 schematically illustrates a partial enlarged view of a front side of a bonded region of a display device to which a structure for forming an overcoat is applied according to an embodiment.
Figure 4:
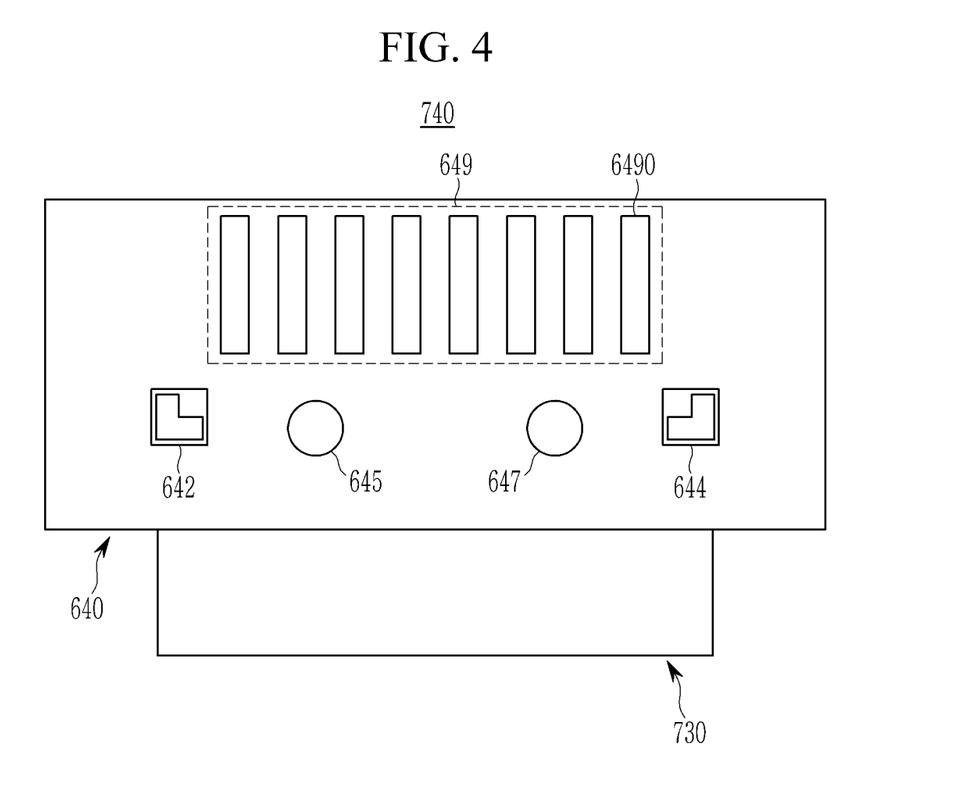
FIG. 4 schematically illustrates a partial enlarged view of a rear side of a bonded region of a display device to which a structure for forming an overcoat is applied according to an embodiment.

FIG. 3 schematically illustrates a partial enlarged view of a front side of a bonded region of a display device having a structure for forming an overcoat according to an embodiment, and FIG. 4 schematically illustrates a partial enlarged view of a rear side of a bonded region of a display device having a structure for forming an overcoat according to an embodiment, and illustrates a bonded region 740.

Referring to FIGS. 3 and 4, a connector 640 may be a region included in the main flexible printed circuit 600, and it may be defined as a region including a pad region 649 in which terminals 6490 are positioned for a connection to the touch flexible printed circuit 700. The bonded region 740 may represent a state in which the connector 640 of the main flexible printed circuit 600 and the terminal portion 730 of the touch flexible printed circuit 700 are disposed to overlap each other for a compressing and bonding process.

Referring to FIGS. 3 and 4, to perform a process for compressing and bonding the main flexible printed circuit 600 and the touch flexible printed circuit 700, it is needed to arrange the main flexible printed circuit 600 and the touch flexible printed circuit 700. In case that the main flexible printed circuit 600 and the touch flexible printed circuit 700 are correctly arranged and the touch flexible printed circuit 700 is compressed on the main flexible printed circuit 600 at a high temperature and a high pressure by using an anisotropic conductive layer, the main flexible printed circuit 600 and the touch flexible printed circuit 700 may be electrically connected to each other through the pad region 649, for example, the terminals 6490 positioned in the pad region 649. In the embodiment, the main flexible printed circuit 600 may be a circuit electrically connected to a first panel and may include alignment marks 641, 642, 643, and 644. Here, the first panel may correspond to the lower substrate 100 and the displaying layer 200 in FIGS. 1 and 2.

The touch flexible printed circuit 700 may be a circuit electrically connected to the second panel perpendicularly disposed on the first panel and may include alignment marks 741 and 743. Here, the second panel may correspond to the upper substrate 300 and the touch sensing layer 400 in FIGS. 1 and 2.

The alignment mark 641 formed on a front side of the connector 640 of the main flexible printed circuit 600 may make a pair with the alignment mark 741 formed on the terminal portion 730 of the touch flexible printed circuit 700 to become an index for confirming whether the main flexible printed circuit 600 and the touch flexible printed circuit 700 are arranged or aligned. Likewise, the alignment mark 643 formed on a front side of the connector 640 of the main flexible printed circuit 600 may make a pair with the alignment mark 743 formed on the terminal portion 730 of the touch flexible printed circuit 700 to become an index for confirming whether the main flexible printed circuit 600 and the touch flexible printed circuit 700 are arranged or aligned.

In the embodiment, the touch flexible printed circuit 700 may include an overcoat region (or coverlay region) C1 formed between the alignment mark 641 and the alignment mark 741. Here, the overcoat region C1 may be a part of the terminal portion 730 of the touch flexible printed circuit 700 for covering or overlapping the connector 640 of the main flexible printed circuit 600.

As the overcoat region C1 is formed between the alignment mark 641 and the alignment mark 741, in the process for manufacturing a display device in addition to the process for compressing the main flexible printed circuit 600 and the touch flexible printed circuit 700, for example, in case that a stress is applied toward the alignment mark 741, breakage of the touch flexible printed circuit 700 such as being torn or damaged may be prevented.

Likewise, the touch flexible printed circuit 700 may include an overcoat region C2 formed between the alignment mark 643 and the alignment mark 743, the overcoat region C2 may be a part of the terminal portion 730 of the touch flexible printed circuit 700 for covering the connector 640 of the main flexible printed circuit 600, and the overcoat region C2 may ease the stress generated toward the alignment mark 743.

In the embodiment, the overcoat regions C1 and C2 may be respectively formed between the alignment marks 741 and 743 and the edges E1 and E2 of the touch flexible printed circuit 700. Accordingly, as a buffer region formed as a part of the terminal portion 730 of the touch flexible printed circuit 700 in an external direction from the alignment marks 741 and 743 is obtained, the touch flexible printed circuit 700 may be firmly maintained in case that the stress is applied toward the alignment marks 741 and 743.

The structure including the overcoat regions C1 and C2 as described above may also be referred to as an overcoat forming structure in the specification. By applying the overcoat forming structure to the display device, the fraction defective of the display device may be substantially reduced by preventing damage to the touch flexible printed circuit 700 that may occur during the manufacturing process.

In the embodiment, the overcoat regions C1 and C2 may be formed below the pad region 649, but the disclosure is not limited thereto, and forming positions of the overcoat regions C1 and C2 may vary according to detailed implementation purposes.

The touch flexible printed circuit 700 may further include an opening 745 penetrating through the touch flexible printed circuit 700 on an opposite side to the overcoat region C1 with respect to the alignment mark 741, and an opening 747 penetrating through the touch flexible printed circuit 700 on an opposite side to the overcoat region C2 with respect to the alignment mark 743. The openings 745 and 747 may be formed in the positions respectively corresponding to openings 647 and 645 penetrating through the main flexible printed circuit 600. The openings 645, 647, 745, and 747 may be used to fix the main flexible printed circuit 600 or the touch flexible printed circuit 700 to other parts or may be used for other purposes. A cross-sectional configuration of the openings 645 and 647 are described with reference to FIG. 5, and the cross-sectional configuration of the openings 745 and 747 may be identical or substantially identical to that of the openings 645 and 647.

Figure 5:
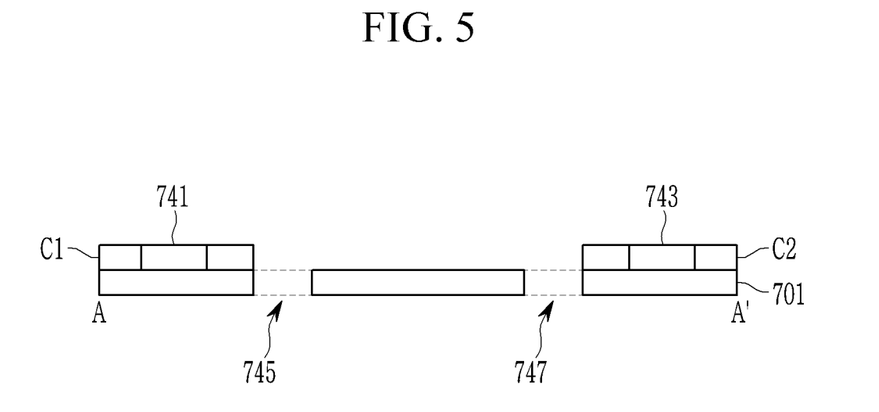
FIG. 5 schematically illustrates a cross-sectional view of a touch flexible printed circuit taken along line A-A' of FIG. 3.

FIG. 5 illustrates a schematic cross-sectional view of a touch flexible printed circuit 700 taken along line A-A' of FIG. 3.

Referring to FIG. 5, the touch flexible printed circuit 700 may include a base film 701, alignment marks 741 and 743, and overcoat regions C1 and C2. Here, the base film 701 may allow the terminal positioned on the base film 701 to overlap the pad region 649 and thereby form an electrical connection with the main flexible printed circuit 600, and the alignment marks 741 and 743 may be formed on the base film 701 for arrangement with the main flexible printed circuit 600. The overcoat region C1 may be formed on the base film 701 between the alignment mark 741 and the edge E1 of the base film 701, and the overcoat region C2 may be formed between the edge E2 facing the edge E1 and the alignment mark 743.

In the embodiment, the overcoat region C1 and the overcoat region C2 may have the same or substantially the same width, but the disclosure is not limited thereto, and the overcoat region C1 and the overcoat region C2 may have different widths depending on detailed implementation purposes.

In this embodiment, the base film 701 is illustrated as being formed between the opening 745 and the opening 747, but the disclosure is not limited thereto, and another film or overcoat may be additionally formed on the base film 701 between the opening 745 and the opening 747 according to detailed implementation purposes.

Figure 6:
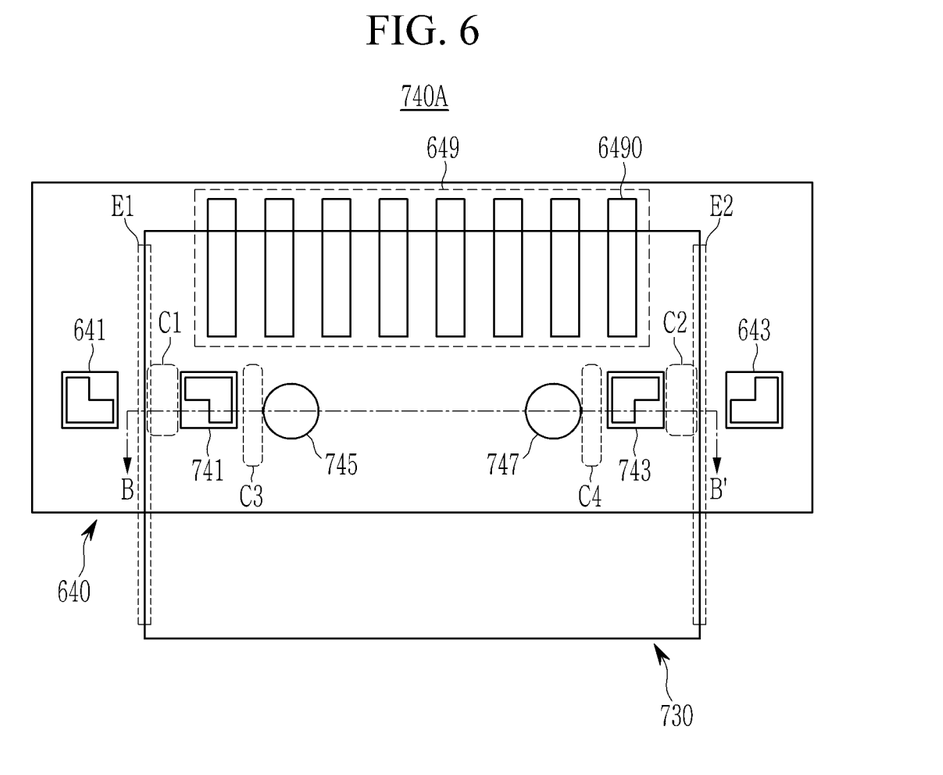
FIG. 6 schematically illustrates a partial enlarged view of a front side of a bonded region of a display device to which a structure for forming an overcoat is applied according to an embodiment.

FIG. 6 schematically illustrates a partial enlarged view of a front side of a bonded region of a display device to which a structure for forming an overcoat is applied according to an embodiment, and illustrates a bonded region 740A.

Referring to FIG. 6, the touch flexible printed circuit 700 may include an overcoat region C1 formed between the alignment mark 641 and the alignment mark 741. Here, the overcoat region C1 may be a part of the terminal portion 730 of the touch flexible printed circuit 700 for covering the connector 640 of the main flexible printed circuit 600. The touch flexible printed circuit 700 may further include an overcoat region C3 formed between the alignment mark 741 and the opening 745, and the overcoat region C3 may be a part of the terminal portion 730 of the touch flexible printed circuit 700 for covering the connector 640 of the main flexible printed circuit 600.

Likewise, the touch flexible printed circuit 700 may include an overcoat region C2 formed between the alignment mark 643 and the alignment mark 743. Here, the overcoat region C2 may be a part of the terminal portion 730 of the touch flexible printed circuit 700 for covering the connector 640 of the main flexible printed circuit 600. The touch flexible printed circuit 700 may further include an overcoat region C4 formed between the alignment mark 743 and the opening 747, and the overcoat region C4 may be a part of the terminal portion 730 of the touch flexible printed circuit 700 for covering the connector 640 of the main flexible printed circuit 600.

The overcoat regions C1 and C3 may ease stress generated toward the alignment mark 741, and the overcoat regions C2 and C4 may ease stress generated toward the alignment mark 743.

By applying the overcoat forming structure including the overcoat regions C1, C2, C3, and C4 to the display device, the fraction defective of the display device may be substantially reduced by preventing damage to the touch flexible printed circuit 700 that may occur during the manufacturing process.

In the embodiment, the overcoat regions C1, C2, C3, and C4 may be formed below the pad region 649, but the disclosure is not limited thereto, and the forming positions of the overcoat regions C1, C2, C3, and C4 may vary depending on the detailed implementation purposes.

Figure 7:
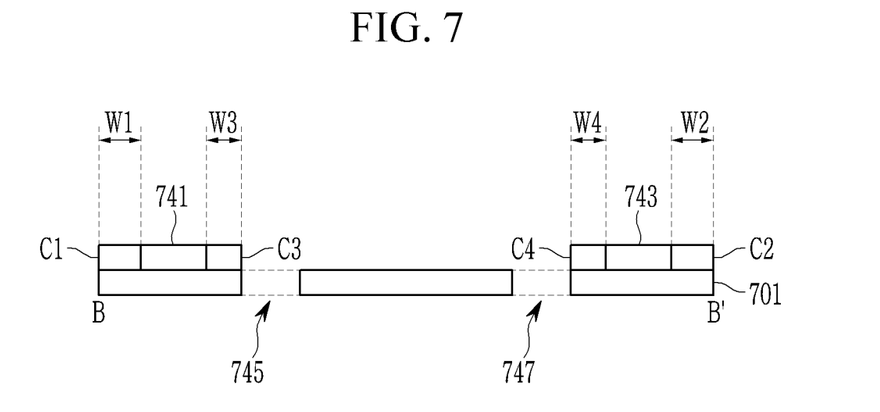
FIG. 7 schematically illustrates a cross-sectional view of a touch flexible printed circuit taken along line B-B' of FIG. 6.

FIG. 7 illustrates a schematic cross-sectional view of a touch flexible printed circuit 700 taken along line B-B' of FIG. 6.

Referring to FIG. 7, the touch flexible printed circuit 700 may include a base film 701, alignment marks 741 and 743, and overcoat regions C1, C2, C3, and C4. Here, the alignment marks 741 and 743 may be formed on the base film 701 for arrangement with the main flexible printed circuit 600. The overcoat region C1 may be formed on the base film 701 between the alignment mark 741 and the edge E1 of the base film 701, and the overcoat region C2 may be formed between the edge E2 facing the edge E1 and the alignment mark 743. The overcoat region C3 may be formed between the alignment mark 741 and the opening 745, and the overcoat region C4 may be formed between the alignment mark 743 and the opening 747.

In the embodiment, a width W1 of the overcoat region C1 may be greater than a width W3 of the overcoat region C3. A width W2 of the overcoat region C2 may be greater than a width W4 of the overcoat region C4.

In the embodiment, the overcoat region C1 and the overcoat region C2 may generally have the same or substantially the same width, but the disclosure is not limited thereto, and the overcoat region C1 and the overcoat region C2 may have different widths depending on detailed implementation purposes.

Likewise, the overcoat region C3 and the overcoat region C4 may generally have the same or substantially the same width, but the disclosure is not limited thereto, and the overcoat region C3 and the overcoat region C4 may have different widths depending on detailed implementation purposes.

In the embodiment, the base film 701 is illustrated as being formed between the opening 745 and the opening 747, but the disclosure is not limited thereto, and another film or overcoat may be additionally formed on the base film 701 between the opening 745 and the opening 747.

Figure 8:
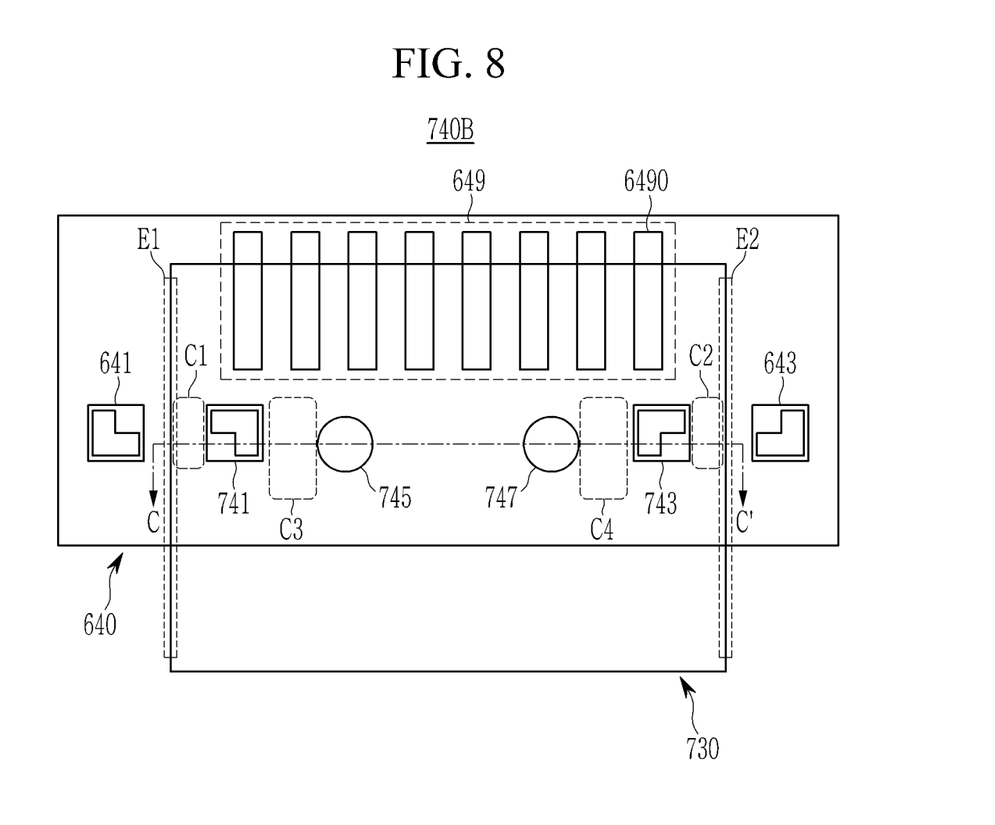
FIG. 8 schematically illustrates a partial enlarged view of a front side of a bonded region of a display device to which a structure for forming an overcoat is applied according to an embodiment.
Figure 9:
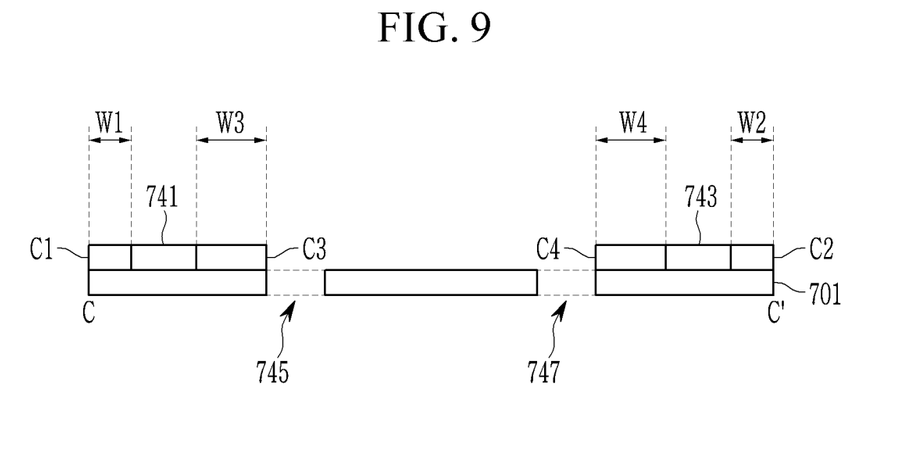
FIG. 9 schematically illustrates a cross-sectional view of a touch flexible printed circuit taken along line C-C' of FIG. 8.

FIG. 8 schematically illustrates a partial enlarged view of a front side of a bonded region of a display device having a structure for forming an overcoat according to an embodiment, and illustrates a bonded region 740B, and FIG. 9 schematically illustrates a cross-sectional view of a touch flexible printed circuit taken along line C-C' of FIG. 8.

As described with reference to FIG. 6, the touch flexible printed circuit 700 may include an overcoat region C1 positioned between the alignment mark 641 and the alignment mark 741, an overcoat region C2 positioned between the alignment mark 643 and the alignment mark 743, an overcoat region C3 positioned between the alignment mark 741 and the opening 745, and an overcoat region C4 positioned between the alignment mark 743 and the opening 747.

The overcoat regions C1 and C3 may ease stress generated toward the alignment mark 741, and the overcoat regions C2 and C4 may ease stress generated toward the alignment mark 743.

As described with reference to FIG. 7, the touch flexible printed circuit 700 may include a base film 701, alignment marks 741 and 743, and overcoat regions C1, C2, C3, and C4.

In the embodiment, a width W1 of the overcoat region C1 may be equal to or less than a width W3 of the overcoat region C3. A width W2 of the overcoat region C2 may be equal to or less than a width W4 of the overcoat region C4.

In the embodiment, the overcoat region C1 and the overcoat region C2 may generally have the same or substantially the same width, but the disclosure is not limited thereto, and the overcoat region C1 and the overcoat region C2 may have different widths depending on detailed implementation purposes.

Likewise, the overcoat region C3 and the overcoat region C4 may generally have the same or substantially the same width, but the disclosure is not limited thereto, and the overcoat region C3 and the overcoat region C4 may have different widths depending on detailed implementation purposes.

In the embodiment, the base film 701 is illustrated as being formed between the opening 745 and the opening 747, but the disclosure is not limited thereto, and another film or overcoat may be additionally formed on the base film 701 between the opening 745 and the opening 747.

According to the embodiments described with reference to FIGS. 6 and 9, in case that the overcoat forming structure is applied to the display device, a sufficient margin between the alignment marks 741 and 743 and the openings 745 and 747 may be obtained, and thus interference between the alignment marks 741 and 743 and the openings 745 and 747 may be prevented so that high accuracy of the bonding process may be maintained.

According to the above-described embodiments, the display device having an overcoat forming structure in which the overcoat is formed between the edge of the touch flexible printed circuit and the alignment mark, may be provided. Therefore, regarding the process for compressing the main flexible printed circuit and the touch flexible printed circuit and the process for manufacturing a display device, damage such as tearing or breaking of the touch flexible printed circuit because of the stress may be prevented, and the fraction defective may be substantially reduced.

According to the embodiments, a sufficient margin between the alignment mark and the opening may be secured in case that the overcoat forming structure is applied to the display device, so that high accuracy of the bonding process may be maintained by preventing the interference between the alignment mark and the opening.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
a main flexible printed circuit including a first alignment mark, the main flexible printed circuit electrically connected to a first panel; and
a touch flexible printed circuit including a second alignment mark, the touch flexible printed circuit electrically connected to a second panel that is perpendicular to the first panel, wherein
the main flexible printed circuit is electrically connected to the touch flexible printed circuit through a pad region, and
the touch flexible printed circuit includes a first overcoat region disposed between the first alignment mark and the second alignment mark, the first overcoat region being a part of a terminal portion of the touch flexible printed circuit for covering a connector of the main flexible printed circuit.

2. The display device of claim 1, wherein
the first overcoat region is disposed between the second alignment mark and a first edge of the touch flexible printed circuit.

3. The display device of claim 1, wherein the touch flexible printed circuit includes:
a first opening that penetrates through the touch flexible printed circuit on an opposite side to the first overcoat region with respect to the second alignment mark; and
a second overcoat region disposed between the second alignment mark and the first opening.

4. The display device of claim 3, wherein a width of the first overcoat region is greater than a width of the second overcoat region.

5. The display device of claim 3, wherein a width of the first overcoat region is equal to or less than a width of the second overcoat region.

6. The display device of claim 3, wherein the first overcoat region and the second overcoat region are disposed below the pad region.

7. The display device of claim 1, wherein
the main flexible printed circuit includes a third alignment mark, and
the touch flexible printed circuit includes:
a fourth alignment mark; and
a third overcoat region disposed between the third alignment mark and the fourth alignment mark.

8. The display device of claim 7, wherein the third overcoat region is disposed between the fourth alignment mark and a second edge of the touch flexible printed circuit.

9. The display device of claim 7, wherein the touch flexible printed circuit includes:
a second opening that penetrates through the touch flexible printed circuit on an opposite side to the third overcoat region with respect to the fourth alignment mark; and
a fourth overcoat region disposed between the fourth alignment mark and the second opening.

10. The display device of claim 9, wherein a width of the third overcoat region is greater than a width of the fourth overcoat region.

11. The display device of claim 9, wherein a width of the third overcoat region is equal to or less than a width of the fourth overcoat region.

12. The display device of claim 9, wherein the third overcoat region and the fourth overcoat region are disposed below the pad region.

13. A display device comprising:
a base film;
a first alignment mark and a second alignment mark disposed on the base film for arrangement with a main flexible printed circuit;
a first overcoat region provided on the base film and disposed between the first alignment mark and a first edge of the base film; and
a second overcoat region disposed between a second edge facing the first edge and the second alignment mark, wherein
the first overcoat region and the second overcoat region are respective parts of a first terminal portion of the touch flexible printed circuit for covering a connector of the main flexible printed circuit.

14. The display device of claim 13, further comprising:
a first opening that penetrates through the base film on an opposite side to the first overcoat region with respect to the first alignment mark; and
a third overcoat region disposed between the first alignment mark and the first opening.

15. The display device of claim 14, wherein a width of the first overcoat region is greater than a width of the third overcoat region.

16. The display device of claim 14, wherein a width of the first overcoat region is equal to or less than a width of the third overcoat region.

17. The display device of claim 13, further comprising:
a second opening that penetrates through the base film on an opposite side to the second overcoat region with respect to the second alignment mark; and
a fourth overcoat region disposed between the second alignment mark and the second opening.

18. The display device of claim 17, wherein a width of the second overcoat region is greater than a width of the fourth overcoat region.

19. The display device of claim 17, wherein a width of the second overcoat region is equal to or less than a width of the fourth overcoat region.

20. The display device of claim 13, wherein the base film is electrically connected to the main flexible printed circuit through a pad region.

* * * * *